(12) United States Patent
Zhang et al.

(10) Patent No.: US 11,646,390 B2
(45) Date of Patent: May 9, 2023

(54) DEVICE, METHOD, AND DISPLAY DEVICE FOR TRANSFERRING MICRO LIGHT-EMITTING DIODES

(71) Applicant: TCL CHINA STAR OPTOELECTRONICS TECHNOLOGY CO., LTD., Guangdong (CN)

(72) Inventors: Wei Zhang, Shenzhen (CN); Yang Sun, Shenzhen (CN); Minggang Liu, Shenzhen (CN); Shujhih Chen, Shenzhen (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 534 days.

(21) Appl. No.: 16/764,892

(22) PCT Filed: Apr. 22, 2020

(86) PCT No.: PCT/CN2020/086145
§ 371 (c)(1),
(2) Date: May 18, 2020

(87) PCT Pub. No.: WO2021/196313
PCT Pub. Date: Oct. 7, 2021

(65) Prior Publication Data
US 2022/0115556 A1  Apr. 14, 2022

(30) Foreign Application Priority Data
Apr. 3, 2020  (CN) .......................... 202010257559.8

(51) Int. Cl.
*H01L 33/00* (2010.01)
*B25J 15/06* (2006.01)
*H01L 21/683* (2006.01)

(52) U.S. Cl.
CPC ........ *H01L 33/005* (2013.01); *B25J 15/0616* (2013.01); *H01L 21/6838* (2013.01)

(58) Field of Classification Search
CPC ...... B23Q 7/005; B23Q 7/043; B25J 11/0095; B25J 15/0616; B25J 15/0038;
(Continued)

(56) References Cited

U.S. PATENT DOCUMENTS
5,888,127 A  3/1999  Piper

FOREIGN PATENT DOCUMENTS
CN  201676674 U  12/2010
CN  208018079 U  10/2018
(Continued)

OTHER PUBLICATIONS
CN210050592U translation (Year: 2020).*

*Primary Examiner* — Monica S Carter
*Assistant Examiner* — Abbie E Quann
(74) *Attorney, Agent, or Firm* — PV IP PC; Wei Te Chung; Ude Lu

(57) ABSTRACT

A device for transferring micro light-emitting diodes includes a collection tube and an elastic port. The collection tube has a first end and a second end arranged oppositely, and a caliber of the collection tube is greater than a diameter of the micro light-emitting diodes. The elastic port is disposed at the first end, and a caliber of the elastic port is less than the diameter of the micro light-emitting diodes. The micro light-emitting diodes are pressed into the collection
(Continued)

tube from the elastic port. The collection tube can store the micro light-emitting diodes. The device can effectively improve transfer speed.

20 Claims, 4 Drawing Sheets

(58) Field of Classification Search
CPC ............ H01L 21/67736; H01L 33/005; H01L 21/683; H01L 21/6838; H01L 21/67769; H01L 21/67763; B65G 47/917
USPC .............................................. 269/20, 21, 46
See application file for complete search history.

(56) References Cited

FOREIGN PATENT DOCUMENTS

| | | | |
|---|---|---|---|
| CN | 110335843 A | | 10/2019 |
| CN | 210050592 U | * | 2/2020 |
| CN | 210050592 U | | 2/2020 |
| JP | H01169937 A | | 7/1989 |
| JP | 2017122608 A | | 7/2017 |

* cited by examiner

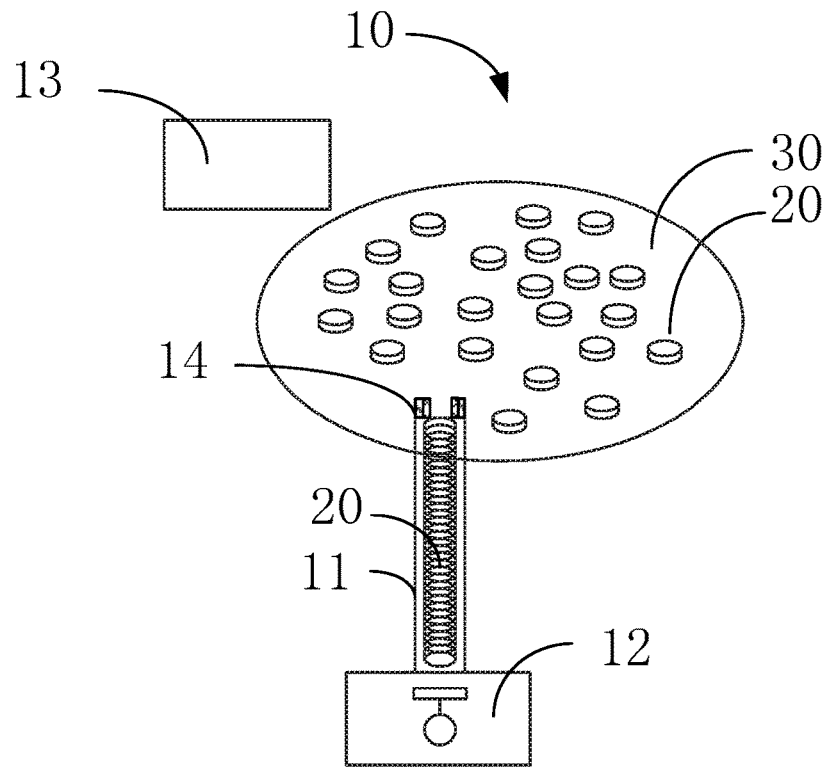

FIG. 3

| |
|---|
| Picking up micro light-emitting diodes from a temporary substrate by a device for transferring the micro light-emitting diodes acoording to any one of claims 1 to 8 — 201 |
| Storing the micro light-emitting diodes in a collection tube of the device for transferring the micro light-emitting diodes — 202 |
| Transferring the micro light-emitting diodes in the collection tube to a target substrate — 203 |

FIG. 4

DEVICE, METHOD, AND DISPLAY DEVICE FOR TRANSFERRING MICRO LIGHT-EMITTING DIODES

CROSS-REFERENCE TO RELATED APPLICATIONS

This is the U.S. National Stage of International Patent Application No. PCT/CN2020/086145 filed Apr. 22, 2020, which in turn claims the benefit of Chinese Patent Application No. 202010257559.8 filed Apr. 3, 2020.

FIELD OF INVENTION

The present disclosure relates to the technical field of display, and particularly to a device, a method, and a display device for transferring micro light-emitting diodes.

BACKGROUND

Micro light-emitting diodes (micro-LEDs) are a new type of self-luminous display technology and have advantages of high brightness, good luminous efficiency, low power consumption, long service life, lightness, and thinness. They are expected to become next-generation mainstream display technology. Compared with LCDs and OLEDs of current mainstream display screens, micro-LEDs have significantly lower power consumption, namely 10% of LCD power consumption and 50% of OLED power consumption, and their brightness is several orders of magnitude higher than brightness of OLEDs.

Micro-LED technology is mainly to dispose miniaturized LEDs of a few micrometers to several tens of micrometers in an array on a substrate to form an LED array with high density and small size. However, current development of micro-LEDs is limited by key technologies such as chip/mass transfer. Currently, bonding of chips and a substrate after mass transfer is a bottleneck to improving yield of micro-LED display technology.

Currently, micro-LED transfer technology mainly comprises transferring by Van der Waals force, electrostatic adsorption, fluidic self-assembly, radiation laser, and the like, aligning, and then welding by heat. However, these transfer methods are slow, thus seriously affecting mass production of micro-LEDs.

SUMMARY OF DISCLOSURE

The present disclosure provides a device, a method, and a display device for transferring micro light-emitting diodes, which can increase a speed of transferring the micro light-emitting diodes, thereby making micro light-emitting diode technology more suitable for mass production.

The present disclosure provides a device for transferring micro light-emitting diodes, comprising:

a collection tube having a first end and a second end arranged oppositely, wherein a caliber of the collection tube is greater than a diameter of the micro light-emitting diodes; and an elastic port disposed at the first end, wherein a caliber of the elastic port is less than the diameter of the micro light-emitting diodes;

wherein the micro light-emitting diodes are pressed into the collection tube from the elastic port, and the collection tube can store the micro light-emitting diodes.

In an embodiment, the device for transferring the micro light-emitting diodes further comprises a driving device disposed at the second end. The driving device provides a driving force to pick up the micro light-emitting diodes from the elastic port into the collection tube.

In an embodiment, the elastic port comprises a fixed sleeve and an elastic piece. The fixed sleeve is detachably connected to the first end. The elastic piece is fixed in the fixed sleeve. The elastic piece has an opening that can be enlarged or reduced.

In an embodiment, the elastic piece is a rubber sleeve, which is disposed at the first end and is provided with an opening that can be enlarged or reduced.

In an embodiment, the device for transferring the micro light-emitting diodes further comprises one or more of the collection tube connected to the driving device.

In an embodiment, the device for transferring the micro light-emitting diodes further comprises a laser peeling device for peeling the micro light-emitting diodes from a temporary substrate.

In an embodiment, the collection tube has a cylindrical cavity, a rectangular cavity, a triangular cavity, a diamond cavity, or a polygonal cavity.

In an embodiment, the collection tube is made of a polyimide plastic, a polyethylene plastic, a polyethylene terephthalate plastic, glass, quartz, or a metal.

In an embodiment, the micro light-emitting diodes are stacked in the collection tube.

The present disclosure further provides a method for transferring micro light-emitting diodes, comprising:

picking up the micro light-emitting diodes from a temporary substrate by a device for transferring the micro light-emitting diodes, wherein the device for transferring the micro light-emitting diodes comprises a collection tube and an elastic port, the collection tube has a first end and a second end arranged oppositely, a caliber of the collection tube is greater than a diameter of the micro light-emitting diodes, the elastic port is disposed at the first end, a caliber of the elastic port is less than the diameter of the micro light-emitting diodes, the micro light-emitting diodes are pressed into the collection tube from the elastic port, and the collection tube can store the micro light-emitting diodes;

storing the micro light-emitting diodes in the collection tube of the device for transferring the micro light-emitting diodes; and transferring the micro light-emitting diodes in the collection tube to a target substrate.

In an embodiment, the device for transferring the micro light-emitting diodes further comprises a driving device disposed at the second end. The driving device provides a driving force to pick up the micro light-emitting diodes from the elastic port into the collection tube.

The present disclosure further provides a display device comprising a device for transferring micro light-emitting diodes. The device for transferring the micro light-emitting diodes comprises a collection tube and an elastic port. The collection tube has a first end and a second end arranged oppositely, and a caliber of the collection tube is greater than a diameter of the micro light-emitting diodes. The elastic port is disposed at the first end, and a caliber of the elastic port is less than the diameter of the micro light-emitting diodes. The micro light-emitting diodes are pressed into the collection tube from the elastic port. The collection tube can store the micro light-emitting diodes.

In an embodiment, the display device further comprises a driving device disposed at the second end. The driving device provides a driving force to pick up the micro light-emitting diodes from the elastic port into the collection tube.

In an embodiment, the elastic port comprises a fixed sleeve and an elastic piece. The fixed sleeve is detachably connected to the first end. The elastic piece is fixed in the fixed sleeve. The elastic piece has an opening that can be enlarged or reduced.

In an embodiment, the elastic piece is a rubber sleeve, which is disposed at the first end and is provided with an opening that can be enlarged or reduced.

In an embodiment, the display device further comprises one or more of the collection tube connected to the driving device.

In an embodiment, the device for transferring the display device further comprises a laser peeling device for peeling the micro light-emitting diodes from a temporary substrate.

In an embodiment, the collection tube has a cylindrical cavity, a rectangular cavity, a triangular cavity, a diamond cavity, or a polygonal cavity.

In an embodiment, the collection tube is made of a polyimide plastic, a polyethylene plastic, a polyethylene terephthalate plastic, glass, quartz, or a metal.

In an embodiment, the micro light-emitting diodes are stacked in the collection tube.

A device for transferring micro light-emitting diodes provided by the present disclosure comprises a collection tube and an elastic port. The collection tube has a first end and a second end arranged oppositely, and a caliber of the collection tube is greater than a diameter of the micro light-emitting diodes. The elastic port is disposed at the first end, and a caliber of the elastic port is less than the diameter of the micro light-emitting diodes. The micro light-emitting diodes are pressed into the collection tube from the elastic port. The collection tube can store the micro light-emitting diodes. The device for transferring the micro light-emitting diodes can pick up the micro light-emitting diodes in different areas, which effectively improves transfer speed. Furthermore, the device for transferring the micro light-emitting diodes can store the micro light-emitting diodes, and can also directly release the micro light-emitting diodes to a target substrate in the next step, which further improves convenience in transfer of the micro light-emitting diodes, making micro light-emitting diode technology more suitable for mass production.

BRIEF DESCRIPTION OF DRAWINGS

In order to more clearly illustrate the technical solutions in the embodiments of the present disclosure, a brief description of accompanying drawings used in the description of the embodiments of the present disclosure will be given below. Obviously, the accompanying drawings in the following description are merely some embodiments of the present disclosure. For those skilled in the art, other drawings may be obtained from these accompanying drawings without creative labor.

FIG. 3 is a schematic diagram of yet another device for transferring micro light-emitting diodes according to an embodiment of the present disclosure.

FIG. 4 is a schematic flowchart of a method for transferring micro light-emitting diodes according to an embodiment of the present disclosure.

DETAILED DESCRIPTION

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within the claimed scope of the present disclosure.

In the description of the present disclosure, it should be understood that location or position relationships indicated by terms, such as "up", "down", "front", "rear", "left", "right", "inside", and "outside" are location or position relationships based on illustration of the accompanying drawings, are merely used for describing the present disclosure and simplifying the description instead of indicating or implying the indicated apparatuses or elements should have specified locations or be constructed and operated according to specified locations, and therefore, should not be intercepted as limitations to the present disclosure.

The present disclosure provides a device, a method, and a display device for transferring micro light-emitting diodes. The device for transferring the micro light-emitting diodes is described in detail below.

Figure 1:
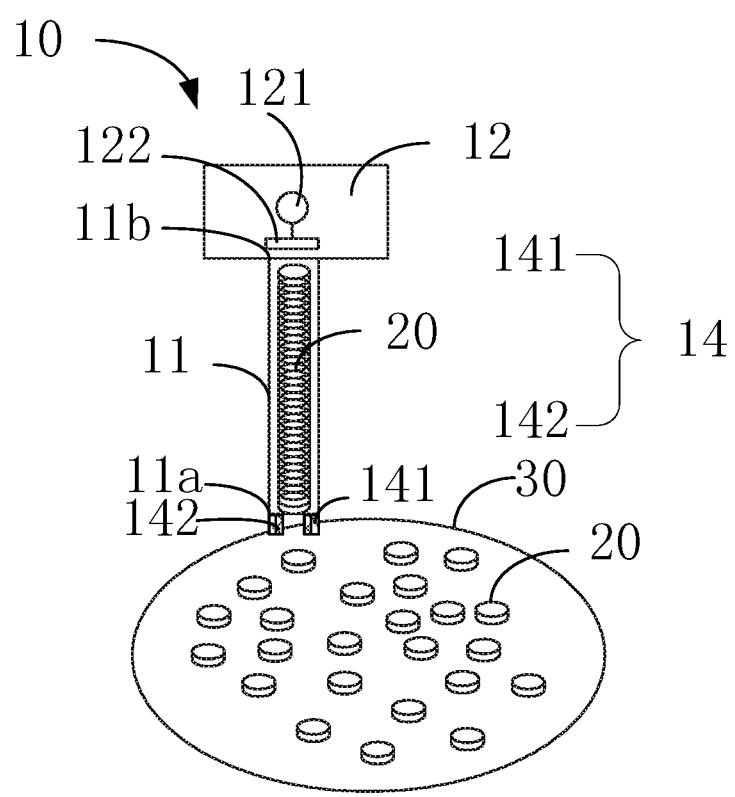
FIG. 1 is a schematic diagram of a device for transferring micro light-emitting diodes according to an embodiment of the present disclosure.

Please refer to FIG. 1, which is a schematic diagram of a device for transferring micro light-emitting diodes according to an embodiment of the present disclosure. The device 10 for transferring the micro light-emitting diodes 20 comprises a collection tube 11 and an elastic port 14. The collection tube 11 has a first end 11*a* and a second end 11*b* arranged oppositely, and a caliber of the collection tube 11 is greater than a diameter of the micro light-emitting diodes 20. The elastic port 14 is disposed at the first end 11*a*, and a caliber of the elastic port 14 is less than the diameter of the micro light-emitting diodes 20. The micro light-emitting diodes 20 are pressed into the collection tube 11 from the elastic port 14. The collection tube 11 can store the micro light-emitting diodes 20.

It should be noted that the first end 11*a* may be a lower end of the collection tube 11, and the second end 11*b* may be an upper end of the collection tube 11. Of course, the first end 11*a* may also be the upper end of the collection tube 11, and the second end 11*b* may also be the lower end of the collection tube 11. It can be understood that "the first end 11*a*" and "the second end 11*b*" are only used to illustrate a relative positional relationship of the collection tube 11, and their positions can be interchanged according to specific usage conditions.

The device 10 for transferring the micro light-emitting diodes 20 further comprises a driving device 12 disposed at the second end 11*b*. The driving device 12 provides a driving force to pick up the micro light-emitting diodes 20 from the elastic port 14 into the collection tube 11.

The driving device 12 may comprise a processor 121 and a power mechanism 122. The processor 121 can receive a processing signal and control the power mechanism 122 to generate power. It can be understood that the power mechanism 122 may be a vacuum pump that can generate vacuum attraction. The vacuum attraction can allow the collection tube 11 to pick up the micro light-emitting diodes 20. The power mechanism 122 can also be an electromagnetic device that can generate electromagnetic force. The electromagnetic force can allow the collection tube 11 to pick up the micro light-emitting diodes 20. The power mechanism 122 is not limited herein, and the embodiments of the present disclosure will not describe them in detail.

The elastic port 14 comprises a fixed sleeve 141 and an elastic piece 142. The fixed sleeve 141 is detachably connected to the first end 11a. The elastic piece 142 is fixed in the fixed sleeve 141. The elastic piece 142 has an opening that can be enlarged or reduced.

The fixed sleeve 141 may be a kit. The fixed sleeve 141 may be made of metal, hard plastic, or the like. The elastic piece 142 can be made of silicone, rubber, or the like. It can be understood that, because the elastic piece 142 has elasticity, under compression, the opening of the elastic piece 142 can be enlarged or reduced. When the elastic member 142 is not pressed, a diameter of the opening is less than the diameter of the micro light-emitting diodes 20. The micro light-emitting diodes 20 are pressed into a cavity of the collection tube 11 from the opening to be stored.

The elastic piece 142 is a rubber sleeve. The rubber sleeve is disposed at the first end 11a and is provided with an opening that can be enlarged or reduced.

It can be understood that, because the rubber sleeve has elasticity, under compression, the opening of the rubber sleeve can be enlarged. When the rubber sleeve is not pressed, a diameter of the opening is less than the diameter of the micro light-emitting diodes 20. The micro light-emitting diodes 20 are pressed into a cavity of the collection tube 11 from the opening to be stored.

Figure 2:
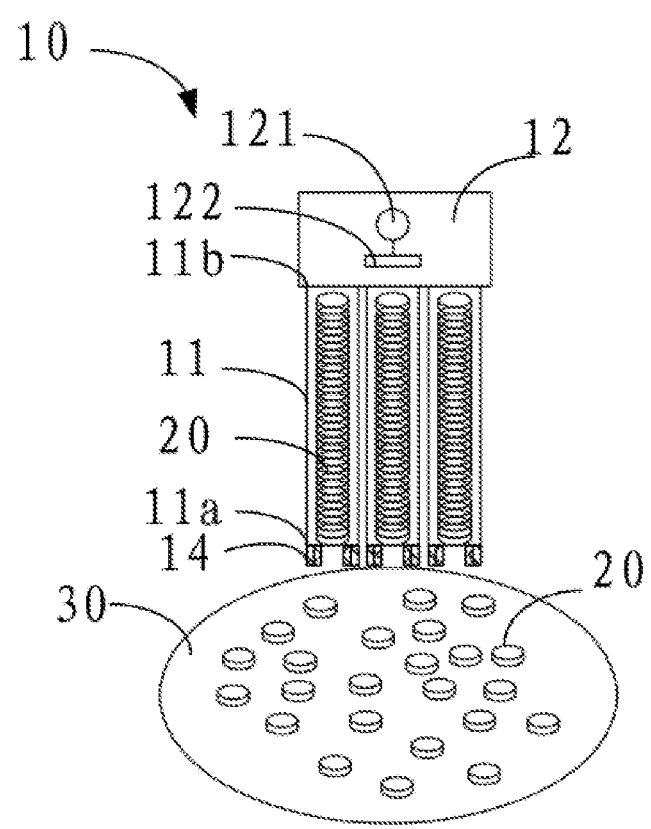
FIG. 2 is a schematic diagram of another device for transferring micro light-emitting diodes according to an embodiment of the present disclosure.

Please refer to FIG. 2, which is a schematic diagram of another device for transferring micro light-emitting diodes according to an embodiment of the present disclosure. are The device 10 for transferring micro light-emitting diodes 20 comprises two or more collection tube 11 connected to a same driving device 12. It can be understood that the collection tubes 11 can pick up the micro light-emitting diodes 20 simultaneously, which can greatly improve a speed of picking up the micro light-emitting diodes 20.

Specifically, the collection tubes 11 are all connected to the same driving device 12, so that the driving device 12 can make the collecting tubes 11 uniformly pick up the micro light-emitting diodes 20. This can not only improve efficiency of picking up the micro light-emitting diodes 20, but also reduce cost.

In addition, each of the collection tubes 11 may be independently connected to a driving device 12, so that each of the collection tubes 11 can pick up the micro light-emitting diodes 20 in a specific area as required. For example, the device 10 for transferring the micro light-emitting diodes 20 may further comprise a detection device that can detect whether the micro light-emitting diodes 20 are qualified. If the detection device detects that the micro light-emitting diodes 20 are unqualified, the detection device can control the corresponding driving device 12 to pick up the unqualified micro light-emitting diodes 20 and then put them into a waste storage area, or store them in the corresponding collection tube 11.

Please refer to FIG. 3, which is a schematic diagram of the other device for transferring micro light-emitting diodes according to an embodiment of the present disclosure. The device 10 for transferring the micro light-emitting diodes 20 further comprises a laser peeling device 13 for peeling the micro light-emitting diodes 20 from a temporary substrate/LED grown substrate 30.

The micro light-emitting diodes 20 are peeled from the temporary substrate 30 by the laser peeling device 13. The device 10 for transferring the micro light-emitting diodes 20 can pick up the micro light-emitting diodes 20 peeled by the laser peeling device 13. The device 10 for transferring the micro light-emitting diodes 20 can pick up the peeled micro light-emitting diodes 20 by gravity. In addition, during a process of the collection tube 11 picking up the micro light-emitting diodes 20, the driving device 12 can be controlled to generate a driving force to control a falling speed of the micro light-emitting diodes 20 in the collection tube 11.

The collection tube 11 has a cylindrical cavity, a rectangular cavity, a triangular cavity, a diamond cavity, or a polygonal cavity.

It can be understood that a shape of the collection tube 11 is not limited herein. The shape of the collection tube 11 may also be adjusted adaptively according to a shape of the micro light-emitting diodes 20.

For example, if the shape of the micro light-emitting diodes 20 is circular, the shape of the collection tube 11 is cylindrical. The caliber of the collection tube 11 is greater than the diameter of the micro light-emitting diodes 20. When the micro light-emitting diodes 20 are stored in the collection tube 11, the micro light-emitting diodes 20 can be stacked. Therefore, the collection tube 11 can collect a plurality of the micro light-emitting diodes 20. Because the collected micro light-emitting diodes 20 are stacked, the micro light-emitting diodes 20 can be arranged well when transferred to a target substrate. This further increases a speed of transferring the micro light-emitting diodes 20.

The collection tube 11 is made of a polyimide plastic, a polyethylene plastic, a polyethylene terephthalate plastic, glass, quartz, or a metal.

It can be understood that a material of the collection tube 11 is not limited herein. The material of the collection tube 11 may also be other materials, such as ceramics.

An embodiment of the present disclosure provides a device 10 for transferring the micro light-emitting diodes 20 comprising a collection tube 11 and an elastic port 14. The collection tube 11 has a first end 11a and a second end 11b arranged oppositely, and a caliber of the collection tube 11 is greater than a diameter of the micro light-emitting diodes 20. The elastic port 14 is disposed at the first end 11a, and a caliber of the elastic port 14 is less than the diameter of the micro light-emitting diodes 20. The micro light-emitting diodes 20 are pressed into the collection tube 11 from the elastic port 14. The collection tube 11 can store the micro light-emitting diodes 20. The device 10 for transferring the micro light-emitting diodes 20 can pick up the micro light-emitting diodes 20 in different areas, which effectively improves transfer speed. Furthermore, the device 10 for transferring the micro light-emitting diodes 20 can store the micro light-emitting diodes 20, and can also directly release the micro light-emitting diodes 20 to a target substrate in the next step, which further improves convenience in transfer of the micro light-emitting diodes 20, making micro light-emitting diode technology more suitable for mass production.

Please refer to FIG. 4, which is a schematic flowchart of a method for transferring micro light-emitting diodes according to an embodiment of the present disclosure. An embodiment of the present application provides a method for transferring miniature light-emitting diodes, comprising the following steps.

201: Picking up the micro light-emitting diodes from a temporary substrate by a device for transferring the micro light-emitting diodes.

It should be noted that the device for transferring the micro light-emitting diodes is the device for transferring the micro light-emitting diodes described in the above embodiment. Because the device for transferring the micro light-emitting diodes has been described in detail in the above embodiments, the device for transferring the micro light-emitting diodes will not be described in detail in this embodiment of the disclosure.

In addition, the device for transferring the micro light-emitting diodes may comprise a plurality of collection tubes to simultaneously pick up the micro light-emitting diodes on the temporary substrate. This can accelerate a speed of picking up micro light-emitting diodes.

202: Storing the micro light-emitting diodes in the collection tube of the device for transferring the micro light-emitting diodes.

It should be noted that the collection tube may have a cylindrical cavity, a rectangular cavity, a triangular cavity, a diamond cavity, or a polygonal cavity. A shape of the collection tube may be adjusted adaptively according to a specific shape of the micro light-emitting diodes.

For example, if the shape of the micro light-emitting diodes is circular, the shape of the collection tube is cylindrical. The caliber of the collection tube is greater than the diameter of the micro light-emitting diodes. When the micro light-emitting diodes are stored in the collection tube, the micro light-emitting diodes can be stacked. Therefore, the collection tube can collect a plurality of the micro light-emitting diodes. Because the collected micro light-emitting diodes are stacked, the micro light-emitting diodes can be arranged well when transferred to a target substrate. This further increases a speed of transferring the micro light-emitting diodes.

203: Transferring the micro light-emitting diodes in the collection tube to a target substrate.

It should be noted that the micro light-emitting diodes in the collection tube are aligned with the target substrate, and then the micro light-emitting diodes are accurately transferred to the target substrate, thereby completing transfer of the micro light-emitting diodes.

In some embodiments, the step of "picking up the micro light-emitting diodes from the temporary substrate by the device for transferring the micro light-emitting diodes" comprises the following step.

A driving device provides a driving force to pick up the micro light-emitting diodes from the temporary substrate. The driving force is any one of vacuum force, electromagnetic force, and electrostatic force.

It should be noted that the driving device may comprise a processor and a power mechanism. The processor can receive a processing signal and control the power mechanism to generate power. It can be understood that the power mechanism may be a vacuum pump that can generate vacuum attraction. The vacuum attraction can allow the collection tube to pick up the micro light-emitting diodes. The power mechanism can also be an electromagnetic device that can generate electromagnetic force. The electromagnetic force can allow the collection tube to pick up the micro light-emitting diodes. The power mechanism is not limited herein, and the embodiments of the present disclosure will not describe them in detail.

In some embodiments, the step of "picking up the micro light-emitting diodes from the temporary substrate by the device for transferring the micro light-emitting diodes" comprises the following steps.

(1) Peeling the micro light-emitting diodes from the temporary substrate.

It should be noted that the micro light-emitting diodes may be peeled from the temporary substrate by the device for transferring the micro light-emitting diodes. Specifically, the driving device in the device for transferring the micro light-emitting diodes generates suction force to peel the micro light-emitting diodes from the temporary substrate. The micro light-emitting diodes are peeled from the temporary substrate by the device for transferring the micro light-emitting diodes. In this way, there is no need to add a peeling process, which can accelerate the speed of transferring the micro light-emitting diodes.

In addition, the micro light-emitting diodes are peeled from the temporary substrate by a laser peeling device.

It should be noted that the micro light-emitting diodes are peeled from the temporary substrate by the laser peeling device. The device for transferring the micro light-emitting diodes can pick up the micro light-emitting diodes peeled by the laser peeling device. The device for transferring the micro light-emitting diodes can pick up the peeled micro light-emitting diodes by gravity. In addition, during a process of the collection tube picking up the micro light-emitting diodes, the driving device can be controlled to generate a driving force to control a falling speed of the micro light-emitting diodes in the collection tube.

(2) Picking up the micro light-emitting diodes peeled from the temporary substrate by the device for transferring the micro light-emitting diodes.

It should be noted that the collection tube not only peels off the micro light-emitting diodes from the temporary substrate, but also collects and stores the micro light-emitting diodes. In this way, the collection tube has multiple functions, thereby reducing processes of transferring the micro light-emitting diodes. This accelerates the speed of transferring the micro light-emitting diodes.

In some embodiments, before the step of "picking up the micro light-emitting diodes from the temporary substrate by the device for transferring the micro light-emitting diodes", the method further comprises the following steps.

(1) Detecting whether the micro light-emitting diodes are qualified.

It should be noted that whether the micro light-emitting diodes are qualified is detected by a detection device. A specific detection may be performed by detecting whether electrical characteristics, optical characteristics, and the like of the micro light-emitting diodes comply with regulations. If the electrical characteristics or optical characteristics of the micro light-emitting diodes are qualified, it is confirmed that the micro light-emitting diodes are qualified micro light-emitting diodes. If the electrical characteristics or optical characteristics of the micro light-emitting diodes are unqualified, it is confirmed that the micro light-emitting diodes are unqualified micro light-emitting diodes.

(2) If the micro light-emitting diodes are unqualified, transfer the unqualified micro light-emitting diodes to a storage area by the device for transferring the micro light-emitting diodes.

It should be noted that the storage area may be a storage device for storing the unqualified micro light-emitting diodes, or may be in the collection tube. If the unqualified micro light-emitting diodes are stored in the collection tube, the unqualified micro light-emitting diodes need to be marked. Therefore, it is ensured that the unqualified micro light-emitting diodes will not be transferred to the target substrate. It can be understood that the mark described in this embodiment of the present disclosure may be a processing method of the processor.

Through the detection of the micro light-emitting diodes in this embodiment of the present disclosure, it can be ensured that the qualified micro light-emitting diodes are transferred to the target substrate, thereby ensuring that the micro light-emitting diodes transferred to the target substrate are available, which can improve effect of a display device.

In the method for transferring the micro light-emitting diodes, the micro light-emitting diodes in different areas can be picked up, which effectively improves transfer speed. Furthermore, the micro light-emitting diodes can be stored or directly released to the target substrate in the next step, which further improves convenience in transfer of the micro light-emitting diodes, making micro light-emitting diode technology more suitable for mass production.

Figure 5:
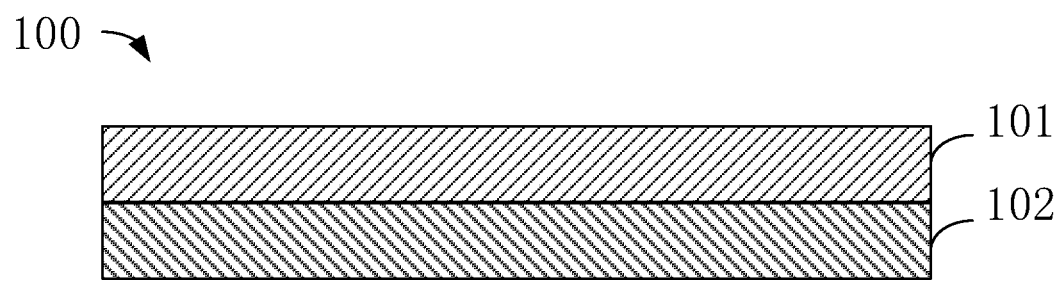
FIG. 5 is a schematic diagram of a display device according to an embodiment of the present disclosure.

Please refer to FIG. 5, which is a schematic diagram of a display device according to an embodiment of the present disclosure. The display device 100 comprises a substrate 102 and a micro light-emitting diode layer 101. The micro light-emitting diode layer 101 is transferred using the above-described method for transferring the micro light-emitting diodes. The method for transferring the micro light-emitting diodes in the above embodiment has been described in detail, and will not be described in detail in this embodiment of the present disclosure.

Because this embodiment of the present disclosure adopts the method for transferring the micro light-emitting diodes in the above embodiment, the display device 100 of the present disclosure is manufactured very quickly and is suitable for mass production.

The device, the method, and the display device for transferring micro light-emitting diodes provided by the embodiments of the present disclosure are described in detail above. The present disclosure uses specific examples to describe principles and embodiments of the present invention. The above description of the embodiments is only for helping to understand the present invention. Furthermore, those skilled in the art may make modifications to the specific embodiments and applications according to ideas of the present invention. In conclusion, the present specification should not be construed as a limitation to the present invention.

What is claimed is:

1. A device for transferring micro light-emitting diodes, comprising:
a collection tube having a first end and a second end arranged oppositely, wherein a caliber of the collection tube is greater than a diameter of the micro light-emitting diodes; and
an elastic port disposed at the first end, wherein a caliber of the elastic port is less than the diameter of the micro light-emitting diodes;
wherein the micro light-emitting diodes are pressed into the collection tube from the elastic port, and the collection tube can store the micro light-emitting diodes.

2. The device for transferring the micro light-emitting diodes according to claim 1, further comprising a driving device disposed at the second end, wherein the driving device provides a driving force to pick up the micro light-emitting diodes from the elastic port into the collection tube.

3. The device for transferring the micro light-emitting diodes according to claim 1, wherein the elastic port comprises:
a fixed sleeve detachably connected to the first end; and
an elastic piece fixed in the fixed sleeve, wherein the elastic piece has an opening that can be enlarged or reduced.

4. The device for transferring the micro light-emitting diodes according to claim 3, wherein the elastic piece is a rubber sleeve, which is disposed at the first end and is provided with an opening that can be enlarged or reduced.

5. The device for transferring the micro light-emitting diodes according to claim 2, further comprising another of the collection tube or a plurality of the collection tubes connected to the driving device.

6. The device for transferring the micro light-emitting diodes according to claim 1, further comprising a laser peeling device for peeling the micro light-emitting diodes from a temporary substrate.

7. The device for transferring the micro light-emitting diodes according to claim 1, wherein the collection tube has a cylindrical cavity, a rectangular cavity, a triangular cavity, a diamond cavity, or a polygonal cavity.

8. The device for transferring the micro light-emitting diodes according to claim 1, wherein the collection tube is made of a polyimide plastic, a polyethylene plastic, a polyethylene terephthalate plastic, glass, quartz, or a metal.

9. The device for transferring the micro light-emitting diodes according to claim 1, wherein the micro light-emitting diodes are stacked in the collection tube.

10. A method for transferring micro light-emitting diodes, comprising:
picking up the micro light-emitting diodes from a temporary substrate by a device for transferring the micro light-emitting diodes, wherein the device for transferring the micro light-emitting diodes comprises a collection tube and an elastic port, the collection tube has a first end and a second end arranged oppositely, a caliber of the collection tube is greater than a diameter of the micro light-emitting diodes, the elastic port is disposed at the first end, a caliber of the elastic port is less than the diameter of the micro light-emitting diodes, the micro light-emitting diodes are pressed into the collection tube from the elastic port, and the collection tube can store the micro light-emitting diodes;
storing the micro light-emitting diodes in the collection tube of the device for transferring the micro light-emitting diodes; and
transferring the micro light-emitting diodes in the collection tube to a target substrate.

11. The method for transferring the micro light-emitting diodes according to claim 10, wherein the device for transferring the micro light-emitting diodes further comprises a driving device disposed at the second end, wherein the driving device provides a driving force to pick up the micro light-emitting diodes from the elastic port into the collection tube.

12. A display device, comprising a device for transferring micro light-emitting diodes, wherein the device for transferring the micro light-emitting diodes comprises a collection tube and an elastic port, the collection tube has a first end and a second end arranged oppositely, a caliber of the collection tube is greater than a diameter of the micro light-emitting diodes, the elastic port is disposed at the first end, a caliber of the elastic port is less than the diameter of the micro light-emitting diodes, the micro light-emitting diodes are pressed into the collection tube from the elastic port, and the collection tube can store the micro light-emitting diodes.

13. The display device according to claim 12, further comprising a driving device disposed at the second end, wherein the driving device provides a driving force to pick up the micro light-emitting diodes from the elastic port into the collection tube.

14. The display device according to claim 12, wherein the elastic port comprises:
a fixed sleeve detachably connected to the first end; and
an elastic piece fixed in the fixed sleeve, wherein the elastic piece has an opening that can be enlarged or reduced.

15. The display device according to claim 14, wherein the elastic piece is a rubber sleeve, which is disposed at the first end and is provided with an opening that can be enlarged or reduced.

16. The display device according to claim 13, further another of the collection tube or a plurality of the collection tubes connected to the driving device.

17. The display device according to claim 12, further comprising a laser peeling device for peeling the micro light-emitting diodes from a temporary substrate.

18. The display device according to claim 12, wherein the collection tube has a cylindrical cavity, a rectangular cavity, a triangular cavity, a diamond cavity, or a polygonal cavity.

19. The display device according to claim 12, wherein the collection tube is made of a polyimide plastic, a polyethylene plastic, a polyethylene terephthalate plastic, glass, quartz, or a metal.

20. The display device according to claim 12, wherein the micro light-emitting diodes are stacked in the collection tube.

* * * * *